Nov. 9, 1954

G. T. KODAMA 2,694,185

ELECTRICAL CIRCUIT ARRANGEMENT

Filed Jan. 19, 1951

INVENTOR.
GEORGE KODAMA
BY
Arthur G. Connolly
HIS ATTORNEY.

2,694,185

ELECTRICAL CIRCUIT ARRANGEMENT

George T. Kodama, Dunstable, Mass., assignor to Sprague Electric Company, North Adams, Mass., a corporation of Massachusetts Application January 19, 1951, Serial No. 206,859

3 Claims. (Cl. 333—70)

Figure 1:
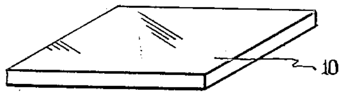

This invention relates to improved electrical circuit assemblies and more particularly relates to printed electrical circuits.

In recent years the trend has been to combine as many electrical components as possible into a single package. This package may then be employed as a subassembly in a radio or control apparatus. To minimize the number of soldered connections, individual elements and the like, very compact printed circuits have been produced by employing a high dielectric constant plate or sheet as the base for screened resistors and also as the dielectric for capacitors. For optimum volume efficiency the ceramic plate is normally a high dielectric constant material such as barium titanate. Capacities sufficient for most audio frequency circuits can be produced on very small plate areas when the dielectric constant exceeds about 1000.

Unfortunately, however, practical difficulties are encountered with the use of such ceramic base materials in conjunction with conventional silver and resistor ink screening techniques. Inherent high stray capacities are noted, particularly at the resistor terminations. As a result the use of printed circuits on high dielectric constant bases has been limited to the low frequency end of the electronic spectrum. When dealing with intermediate, radio and high frequencies, these stray capacities are sufficiently large to render the general assembly unsuitable.

It is an object of the present invention to overcome the foregoing and related disadvantages. A further object is to produce by novel and inexpensive means a printed circuit assembly containing resistors and capacitors with very low stray capacities. A primary object is to provide a simple and compact verticle sync integrating assembly for video apparatus which will be completely free of the stray coupling capacitance commonly encountered in present conventional constructions. Additional objects will become apparent from the following description and claims.

These objects are attained in accordance with the invention wherein there is produced a printed circuit assembly comprising a thin sheet of high dielectric constant material on the surfaces of which are applied a plurality of resistance layers and metal capacitor electrodes, a thin layer of low dielectric constant insulation being interposed between said sheet on the one hand, and said resistance layers and the terminating connections for said resistance layers on the other hand.

In a more restricted sense the invention is concerned with an electrical circuit assembly comprising a thin sheet of ceramic material having a dielectric constant in excess of about 50 on the plane surfaces of which are provided a plurality of metal capacitor electrodes and at least one resistance layer, a thin layer of dielectric material with a dielectric constant less than about ten being interposed between said sheet and the combination of resistance layers and resistance terminal connections.

In one of its limited embodiments the invention refers to a printed circuit assembly comprising a sheet of ceramic material with a thickness between about 5 and about 50 mils and a dielectric constant in excess of 1000 on the plane surfaces of which are provided a plurality of silver capacitor electrodes, silver terminating areas for resistance layers and at least one resistance layer, a layer of vitreous ceramic material with a thickness of between about ½ mil and about 5 mils and possessing a dielectric constant below about 10 separating said terminating areas and said resistors from said sheet.

According to my invention I have found that the high stray capacities inherent in printed circuits fabricated on a high dielectric constant ceramic base can be substantially overcome by the use of a simply applied low dielectric constant insulating layer between the ceramic base and the resistance layers and terminating points. Thus I have produced a combined high and low dielectric constant article which can be used over a wide frequency range without encountering the prior difficulties with inherent high stray capacities.

My method consists of first screening, spraying or otherwise applying a thin layer of a dielectric material, such as vitreous enamel frit in a temporary binder, on those portions of the high dielectric constant plate where the resistors and the resistor terminations will be located. Thereafter the metal electrodes, usually silver in a temporary binder, are similarly applied to one or both sides of the ceramic sheet to produce capacitor electrodes and terminating areas. The plate with the silvered low dielectric constant enamel is then fired at 700 or 800° C. to produce a permanent unitary assembly and the resistance layers are applied to the appropriate areas by screening of resistor ink, spraying or other suitable methods.

Alternately, a resin layer, which may be loaded with ceramic particles, is applied under the resistor pattern. In such instances, the resistor terminating areas may be produced with a silver paint that requires lower processing temperatures. The resulting assembly, while requiring but a single screening or spraying additional to the prior art process, will be characterized by extremely low stray capacity from the resistor elements and resistor terminations to the capacitor elements or other adjacent elements on either side of the ceramic plate. This may be attributed to the capacitance-reducing effect that the low dielectric constant vitreous enamel has when inserted in series with the high dielectric constant material between electrodes on opposite sides of the dielectric sheet. The reduction in capacitance is due not only to the lower dielectric constant but to the increased spacing provided by the added thickness between the opposite coatings. Conductive elements adjacent to each other on the same surface of the ceramic plate also have their fringe or edge-effect capacitance greatly reduced apparently because the fringe capacitance depends on the dielectric constant of the support carrying these adjacent elements.

Reference will be made to the appended drawing which shows a finished printed circuit assembly produced in accordance with the invention as well as the various steps by which it is made.

Fig. 1 shows a base ceramic plate 10 which has a dielectric constant of at least 50 and preferably in excess of 1000. The thickness of this plate is ordinarily between about 5 mils and about 50 mils with length and width adjusted to the particular circuit to be produced. For typical applications barium strontium titanate and zirconate based dielectrics are employed where high capacity per unit volume is desired. A suitable dielectric plate is a barium strontium titanate having 23% strontium titanate. In other instances, particularly for high frequency, high "Q" applications, titanium dioxide dielectric sheets may be employed.

Figure 2:
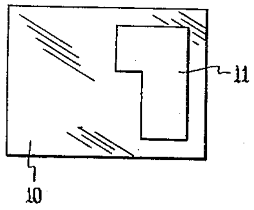

Fig. 2 shows a top view of the ceramic plate 10 with a layer 11 of low dielectric constant vitreous enamel suspended in a temporary binder applied to the resistor layer pattern and resistor terminal connection pattern.

Figure 3A:
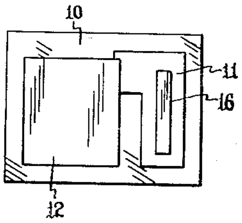
Figure 3B:
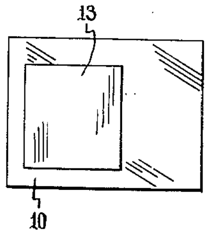

Figs. 3A and 3B are top and bottom views of the plate after the next step in manufacture, with the capacitor electrodes and the terminal connection for the resistor applied. The terminal 16 is screened on top of layer 11. Capacitor electrodes 12 and 13 are also applied at this time. These ordinarily consist of silver particles suspended in a temporary binder, suitable formulations for which are described in the Natoinal Bureau of Standards Circular 468 issued November 15, 1947, pages 5, 6 and 7.

At this point, the plate is fired in a furnace or otherwise to remove the binder from the electrode silver and from the enamel dielectric. This firing operation usually takes place at a temperature from about 450° C. to about 800° C., for a period sufficient to effect removal of all organic matter and sintering or fusion of the inorganic materials present. Lower firing temperatures can be used however, with appropriate compositions.

Figure 4:
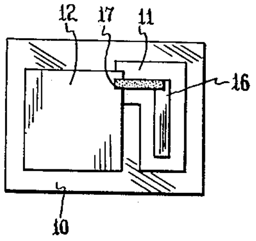

In Fig. 4, resistor element 17 is shown screened or otherwise applied between terminal 16 and electrode 12 as the next step. It is to be noted that layer 11 preferably extends beyond the edges of the terminal and the resistor by a measurable amount, for example, ordinarily at least 50 mils, to obtain best characteristics. Suitable resistor coating formulations are shown on pages 7, 8 and 9 of the above circular.

Figures 5A, 5B:
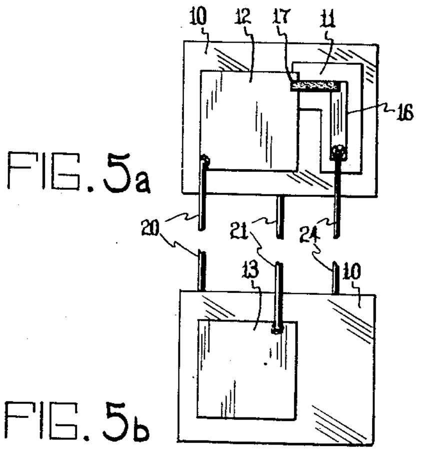

Figs. 5A and 5B show the plate with terminal wires soldered to the various electrodes and terminal. These may be applied by placing the wires against the silver surface and then dipping the whole assembly in a solder bath. Terminal 20 is affixed to electrode 12; terminal 21 to electrode 13; and terminal 24 to terminal 16.

Figure 6:
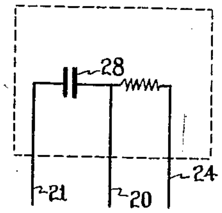

Fig. 6 shows a schematic wiring diagram for the printed circuit whose preparation is described above. While this is simpler than most circuits, it is intended to illustrate the inclusion of a resistor element as part of the circuit without the stray capacity usually found between the resistor and the other circuit elements.

As previously indicated, it is possible to use a low dielectric constant underlayer which need not be fired at high temperatures. For example, various resinous materials, such as polyesters, polyvinyl compounds, condensation resins, etc., are suitable for use because of their relatively low dielectric constants. It is of course necessary that these resins, in their final state, should adhere to the ceramic surface. The latter is normally microscopically rough and adhesion is readily obtained with careful selection of resin material. Typical materials include resins obtained by copolymerizing polyethoxylene resins with butylated urea formaldehyde resins; plain or modified linseed oil-melamine-formaldehyde resins, alkyd resins, polytetrafluoroethylene, etc. These may be loaded with ceramic materials, such as talc, china clay and zinc oxide to improve the screening consistency and to modify the characteristics of the final underlayer.

While the low dielectric constant material is normally applied by screening through silk or steel screens, it can also be applied to the electrode materials and/or ceramic base by printing, spraying, painting or other methods. The enamels used may be selected from those which are ordinarily applied for vitreous coatings and glazes for metalware, ceramics, etc. Adherence to the underlying ceramic piece is important. Where low-loss printed circuits are desired, lead silicate type enamels, such as potassium lead silicate, are preferred. For example, one good enamel frit consists of about 65 parts by weight of lead oxide, 30 parts by weight of silica, 4 parts by weight of potassium oxide and one part by weight of alumina. Suitable temporary binders are numerous; typical is hydrogenated rosin, with a rosin ester plasticizer and pine oil as a solvent.

In order to secure a slightly rough and unglazed surface to which the resistance material will adhere, the enamel frit may have admixed therewith from about 2% to about 23% of a non-fusing inorganic filler such as talc.

When resin-based low dielectric constant layers are employed, as, for example, when it is not desired to fire the layer and/or the silver electrodes at high temperatures, a representative screening ink consists of from about 20 to about 60 parts of a 50–50 mixture of linseed oil and melamine-formaldehyde resin, from about 0 to about 60 parts of finely ground talc and from about 20 to about 80 parts of a solvent for the resin. The underlayer laid down from the above ink may be baked for one hour at 75° C. and for six hours at 150° C. to complete solvent removal and hardening of the resin.

While the invention has been described with particular reference to one of the preferred embodiments, namely, the use of a low dielectric constant layer to reduce the stray capacity between resistor elements and other elements of the printed circuit assembly, the invention finds wide use in other ways. One important embodiment is described in connection with Figs. 7 and 8.

Figures 7, 9:
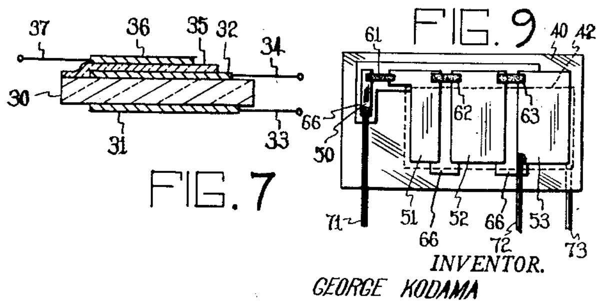

Fig. 7 shows a cross section of a simple dual capacitor unit containing a low capacity, a low loss capacitor element and a high capacity, lower "Q" unit. The construction is essentially similar to that shown in connection with Figs. 1 through 5 with the elimination of the resistor element and the addition of capacitive overlap between the low dielectric constant layer and one of the base electrode layers. Element 30 is the high dielectric constant ceramic plate upon which are provided thin electrode layers 31 and 32 which are terminated as indicated at 33 and 34 respectively. Low dielectric constant layer 35, preferably the vitreous enamel type, but optionally a resin binder type, overlaps a portion of electrode 32. Disposed on top of layer 35 is electrode 36, ordinarily a fired on silver layer when insulation 35 is a vitreous enamel. Terminal 37 is provided for electrode 36.

Figure 8:
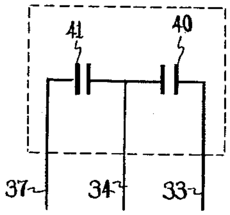

Fig. 8 shows a simplified schematic diagram of the circuit of the element of Fig. 7. Low capacity, high "Q" capacitor 41 is disposed between terminals 37 and 34, while high capacity, low "Q" capacitor 40 is disposed between terminals 33 and 34. This simple example illustrates the use of the invention to produce a combined high and low dielectric constant article wherein portions of the assembly are suited to high frequency, low loss circuit introduction, while the other high capacity units are available for audio and lower frequency circuits.

It is to be understood that the printed circuits produced in accordance with the invention may contain resistance elements, high "Q" capacitors and high capacity capacitors in various combination to provide characteristics not heretofore attainable by prior art techniques.

A feature of the present invention is that it enables the construction of inexpensive and compact selective circuits that are of exceptionally high efficiency. Thus a very effective low-pass filter circuit is provided by the construction of Fig. 5A which can have terminal 21 grounded or common to the input and output circuits, terminal 24 terminal 20 as the other input lead, and as the other output lead. By reason of the spacing layer 11, the capacitance across the resistor 17 is quite low notwithstanding the use of a very compact construction and a very high dielectric constant capacitor dielectric. Any appreciable capacitance between input and output leads will be in direct competition with the high-frequency by-passing capacitance 28 (see Fig. 6) so that the undesired high frequency signals are not as effectively shunted. This undesired capacitance is even further reduced by spacing the leads (20, 24) from the opposite ends of resistor 17, as much as possible as shown in Fig. 5A.

The same type of construction can also be used as a low-pass filter with the capacitance 28 connected across the output terminal of the resistor rather than its input terminal. This is effected by merely interchanging the leads 20, 24 so that lead 24 is the input and lead 20 the output, the lead 21 remaining common to both input and output circuits. The above-described reduction of capacitance between the resistor terminals has the same desirable effect in this form of the invention.

The resistor-capacitor combination of the invention can also be connected as a high-pass filter in which it also exhibits the above advantages. For this type of operation the unit of Fig. 5A has lead 24 connected in common to both input and output circuits, with leads 20 and 21 as the input and output terminals. Where the resistance is to be across the input, lead 20 is the input terminal, otherwise lead 21 is the input terminal.

The advantages of the present invention can be additionally obtained in integrating or differentiating circuits. As is well known these types of circuits are those that have integrating and differentiating action respectively on electrical signals, and can be conveniently provided by resistance and capacitance series combinations. Thus where signals are impressed across a series-connected resistance and capacitance and the resistance is large as compared with the capacitive impedance, the voltage appearing across the capacitance will be the integral of the impressed signals. Conversely where the resistance is small as compared with the capacitive impedance, the voltage appearing across the resistance is the differential of the impressed signals. In either case the capacitance across the resistance should be minimized to improve the efficiency.

A particularly useful application of the present invention is in the vertical sync integrating circuit of a television receiver where the picture-synchronizing pulse signals are supplied and the circuit delivers the low frequency vertical pulses. A number of integrating resistance-capacitance circuits are usually connected in cascade to give satisfactory performance. In accordance with the present invention the entire cascade combination can be placed on a single compact supporting sheet and operates very satisfactorily. No more than three integrating stages are needed in the cascade, and in some cases only two are sufficient. The entire integrating circuit assembly is accordingly quite compact.

Fig. 9 shows a representative form of such integrating circuit. A plate 40 of high dielectric constant material such as the barium-strontium titanate described above has on one face a conductive coating 42 to which is electrically connected as by soldering to a lead 73. On the opposite face of plate 40 are four different conductive coatings 50, 51, 52 and 53 connected by resistive links 61, 62 and 63.

As in the simpler embodiment described above, the resistive links are all separated from the high dielectric constant plate 40, by a low dielectric constant stratum 66. In the form shown the stratum 66 is a continuous supporting layer beneath coating 50 and the portions of the coatings 51, 52 and 53 to which the individual resistances are connected. Additional leads 71 and 72 are connected to coatings 50 and 53 respectively.

In operation lead 73 is common to input and output circuits, lead 71 is the other input lead and lead 72 the other output lead. It will be noted that the incoming signals are impressed across the series connected resistance 61 and capacitance 51—42. Another series chain, resistance 62 and capacitance 52—42, is connected across capacitance 51—42 to act as a second section of the cascade, and a third series chain 63 and 53—42 across the second capacitance 52—42 supplies a third section. The integrated signals are taken from across capacitance 53—42.

To further minimize undesired capacitance, capacitive coating 42 is kept from extending under or close to the resistances and the lead coating 50. Furthermore the capacitance-reducing layer 66 is extended under all adjacent parts of the capacitor electrode coatings 51, 52, 53 and the space between conductive coatings 50 and 51 may be somewhat larger than between the other coatings. Normally less capacitance is used in the first section of the integrating cascade so that a smaller electrode 51 is needed.

As many apparently different embodiments of this invention may be made without departing from the spirit and scope hereof, it is to be understood that the invention is not limited to the specific embodiments hereof except as defined in the appended claims.

What is claimed is:

1. A vertical sync integrating assembly comprising a base plate of high-dielectric-constant material, a single large conductive coating deposited on one face of said plate, a series of closely spaced conductive coatings on the other face of said plate and positioned opposite said large conductive coating to form separate capacitors therewith, a terminal conductive coating on said other face of said plate and spaced from said series of conductive coatings, a low-dielectric-constant stratum positioned beneath the entire adjacent edge portions of said spaced series of conductive coatings and also extending beneath the entire terminal conductive coating, resistance coatings on said low-dielectric-constant stratum separately connected between the conductive coatings on said other face, a terminal lead attached to said terminal conductive coating, a second terminal lead attached to the remotely connected one of said series of conductive coatings on said other face of said plate, and a third terminal lead connected to said large conductive coating.

2. A printed circuit assembly comprising a plate of high-dielectric-constant material, a large conductive coating on one face of said plate, a series of closely spaced conductive coatings on the other face of said plate opposite said large conductive coating to provide separate capacitances with the large coating, a low-dielectric-constant stratum positioned beneath the entire adjacent edge portions of said series of conductive coatings on said other face of said plate, a resistance coating on the low-dielectric-constant stratum and connecting said adjacent conductive coatings on said other face, and terminal leads connected respectively to said large conductive coating, to one of said series of coatings, and to the resistance coating.

3. A printed circuit assembly comprising a plate of high-dielectric-constant material, a large conductive coating on one face of said plate, a series of closely spaced conductive coatings on the other face of said plate opposite said large conductive coating to provide separate capacitances with the large coating, a low-dielectric-constant stratum positioned beneath the entire adjacent edge portions of said series of conductive coatings on said other face of said plate, and leads connected respectively to said conductive coatings.

References Cited in the file of this patent

UNITED STATES PATENTS

| Number | Name | Date |
|---|---|---|
| 2,474,988 | Sargrove | July 5, 1949 |
| 2,493,199 | Khouri | Jan. 3, 1950 |
| 2,566,666 | Khouri | Sept. 4, 1951 |

FOREIGN PATENTS

| Number | Country | Date |
|---|---|---|
| 566,986 | Great Britain | Jan. 23, 1945 |